United States Patent [19]
Cheng et al.

[11] Patent Number: 5,710,711
[45] Date of Patent: Jan. 20, 1998

[54] METHOD AND INTEGRATED CIRCUIT ADAPTED FOR PARTIAL SCAN TESTABILITY

[75] Inventors: Kwang-Ting Cheng; Jing-Yang Jou, both of Edison, N.J.

[73] Assignee: Lucent Technologies Inc., Murray Hill, N.J.

[21] Appl. No.: 550,421

[22] Filed: Oct. 30, 1995

Related U.S. Application Data

[63] Continuation of Ser. No. 964,163, Oct. 21, 1992, abandoned.
[51] Int. Cl.[6] ............................................. G06F 17/50
[52] U.S. Cl. ................................. 364/491; 371/22.3
[58] Field of Search ........................... 364/488, 489, 364/490, 491; 371/22.1, 22.3, 22.5, 22.6, 22.4, 25.1; 324/158.1, 73.1; 326/16

[56] References Cited

U.S. PATENT DOCUMENTS

| | | | |
|---|---|---|---|
| 3,916,387 | 10/1975 | Woodrum | 395/800 |
| 4,445,776 | 5/1984 | Hyatt | 355/78 |
| 5,018,201 | 5/1991 | Sugawara | 395/2.61 |
| 5,043,986 | 8/1991 | Agrawal et al. | 371/25.1 |
| 5,057,462 | 10/1991 | Eisenberg et al. | 437/229 |
| 5,130,646 | 7/1992 | Kojima | 371/22.3 |
| 5,130,647 | 7/1992 | Sakashita et al. | 371/22.3 |
| 5,132,974 | 7/1992 | Rosales | 371/22.3 |
| 5,150,044 | 9/1992 | Hashizume et al. | 371/22.3 |
| 5,163,016 | 11/1992 | Har'El et al. | 364/578 |
| 5,241,266 | 8/1993 | Ahmad et al. | 324/158 R |

OTHER PUBLICATIONS

D. H. Lee and S. M. Reddy, "On Determining Scan Flip-Flops in Partial-Scan Designs," *Int'l Conf. on Computer-Aided Design*, (ICCAD-90) (Nov. 1990).

*Primary Examiner*—Emanuel T. Voeltz
*Assistant Examiner*—Edward J. Pipala
*Attorney, Agent, or Firm*—William Ryan; Jason P. DeMont; Robert E. Rudnick

[57] ABSTRACT

A method and apparatus are taught which modify digital integrated circuits for partial scan testing and do so with little or no impact on the circuit's performance characteristics. Illustratively, the scan memory elements are selected from among all memory elements in a circuit based on their ability to eliminate feedback cycles in the circuit and on considerations of the potential performance degradation due to the inclusion of scan memory elements. A feedback cycle is defined as a feedback path from the output of a memory element to the input of said memory element.

11 Claims, 6 Drawing Sheets

METHOD AND INTEGRATED CIRCUIT ADAPTED FOR PARTIAL SCAN TESTABILITY

This application is a continuation of application Ser. No. 07/964,163, filed on Oct. 21, 1992, now abandoned.

FIELD OF THE INVENTION

The invention relates to the testing of electric circuits in general, and more particularly, to methods and apparatus for testing integrated circuits with partial scan techniques.

BACKGROUND OF THE INVENTION

While the state of the art in semiconductor manufacturing enables the fabrication of integrated circuits with more than a million circuit elements, the process is imperfect and produces integrated circuits which may comprise unpredictable and dissimilar faults which prevent the circuits from functioning as designed. And since a disfunctional circuit can have catastrophic consequences, it proves prudent in many situations to ensure the integrity of each circuit before it is incorporated into other equipment.

Techniques for testing simple integrated circuits are well known to those skilled in the art. One method involves stimulating a circuit's inputs with one or more "test vectors" and retrieving from the circuit's outputs the "resultant vectors" which are the direct consequence of the test vectors. As long as the circuit is designed to produce a deterministic output which is based on its input, the resultant vectors can be predicted. A circuit comprising a fault is revealed when the circuit produces one or more resultant vectors which are inconsistent with those which were predicted.

While testing simple circuits is relatively straightforward, techniques for testing complex circuits comprising millions of transistors and thousands of memory elements is problematic. For the purposes of this disclosure a memory element is defined as a flip-flop, latch or any other circuit element which is capable of retaining a signal for some temporal period after the signal has been removed from the memory element's input. Memory elements complicate the testing of integrated circuits because (1) they can delay the propagation of fault effects through the circuit and (2) they can provide the keystone for feedback mechanisms which intermittently conceal faults.

In general, each manufactured circuit can be either exhaustively tested, which can guarantee that the circuit is totally free from manufacturing defects, or partially tested, which, when used in conjunction with statistical methods, provides some degree of confidence that the circuit is unblemished. Other things being equal, the exhaustive testing of complex integrated circuits is either technologically infeasible or disproportionately expensive when compared to the costs and benefits associated with partial testing.

Many techniques have been employed to screen out defective integrated circuits. At one time, integrated circuit testing was performed by machines comprising a large number of electrically conductive probes. These probes were put in physical contact with selected nodes in the circuit so that the test vectors could be introduced into the circuit and the resultant vectors retrieved. This technique lost favor, however, as inefficiencies associated with the method were compounded by the increasing complexity of integrated circuits.

Another technique for testing integrated circuits avoids conductive probes and instead uses a focused electron beam to charge selected circuit elements in the integrated circuit. While the electron beam technique overcomes some of the drawbacks associated with conductive probes it is slow and has the potential side effect that it can introduce faults into the circuit.

Historically, integrated circuits were not been designed to facilitate testing. Recently, however, one paradigm, known as design-for-testability, has been propounded which suggests that integrated circuit testing could be simplified if the integrated circuit was designed with after-manufacture testing in mind.

One design-for-testability technique is known as "scan testing." In scan testing, special-purpose test circuitry is advantageously incorporated into the integrated circuit so that it can be alternately switched between an "operation mode" and a "test mode" by an externally generated control signal.

When the integrated circuit is in operation mode, it is preferred that the combinational logic and memory elements are electrically connected so as to enable the circuit to operate in the manner for which it was designed and fabricated. In test mode, it is preferred that a subset of the memory elements (the "scan memory elements") are electrically insulated from the other memory elements (the "non-scan memory elements") and the combinational logic in the circuit and are configured in a manner so as to facilitate testing.

Testing is advantageously accomplished with external test equipment which supplies the test vectors and checks the resultant vectors. First, the scan memory elements are themselves tested by putting the circuit into test mode. A test vector is shifted into the scan memory elements and out again to test the ability of each scan element to be set and reset. It is well known to those skilled in the an how to generate the test vector and check the resultant vector.

Next, testing of the entire circuit begins by shifting a test vector into the scan memory elements while the circuit remains in test mode. After the test vector is loaded, the circuit is forced into function mode for a predetermined number of clock periods so that the states of the scan memory elements can be affected by the combinational logic and non-scan memory elements. After the predetermined number of clock periods, the circuit is again put into test mode so that the states of the affected scan memory elements can be retrieved from the circuit. The resultant vector is then compared with that which is expected. Because each test vector can typically only check a fraction of the potential faults in a circuit, the procedure is advantageously repeated with different test vectors until some desired level of fault coverage is achieved.

When all of the memory elements in an integrated circuit are reconfigurable into a test mode shift register, the testing technique is known as "full scan testing" and when fewer than all of the memory elements in the integrated circuit are reconfigurable it is known as "partial scan testing". Full scan testing is advantageous in that it enables an integrated circuit to be easily and thoroughly tested. It has one disadvantage, however, in that it typically causes the integrated circuit to consume more space on the integrated circuit than it would without the additional test circuitry. Partial scan testing consumes less space on the integrated circuit than full scan testing but requires that the memory elements which comprise the test mode shift register be judiciously chosen so that fault coverage is not compromised. Furthermore, techniques in the prior art often add circuitry to an integrated circuit in such a manner such that the added circuitry slows the maximum operation of the integrated circuit.

Figure 1:
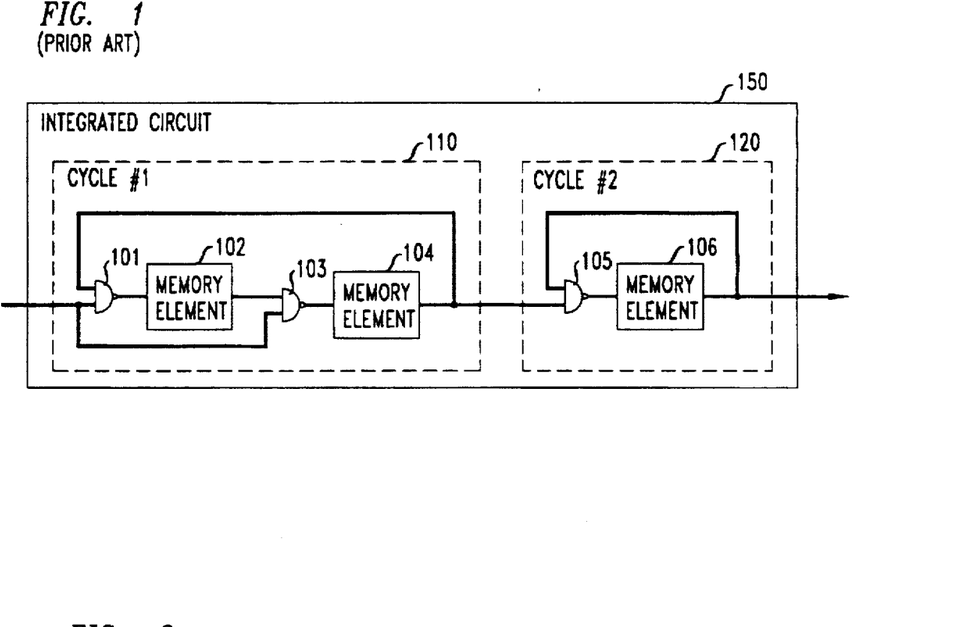
FIG. 1 shows a schematic of a digital circuit comprising two cycles which in turn comprise combinational logic and memory elements.

Empirically, the level of difficulty associated with testing an integrated circuit depends on the topology of that circuit. More specifically, on the existence and nature of a topological feature called a "cycle". For the purpose of this disclosure, a cycle is defined as a circuit path which feeds a signal from a memory element back into that memory element. Example cycles are shown in FIG. 1 within integrated circuit 150. Cycle 110 comprises memory elements 102 and 104 and NAND gates 101 and 103. Cycle 120 comprises memory element 106 and NAND gate 105.

Each cycle in a circuit can be characterized by a measure of its "length". For the purposes of this disclosure, a cycle's length is defined as the number of memory elements in a given cycle (including the memory element which serves as the "beginning" and "end" of the cycle. Cycle 110, in FIG. 1 for example, has a length of two while cycle 120 has a length of one.

V. D. Agrawal et al., U.S. Pat. No. 5,043,986, issued Aug. 27, 1991 teaches a method of partial scan testing in which memory elements are typically selected to be scan memory elements based on their respective ability to "break" a cycle—that is on their presence within a cycle.

D. H. Lee and S. M. Reddy in "On Determining Scan Flip-Flops in Partial-Scan Designs," *Int'l Conf. on Computer-Aided Design*, (ICCAD-90) (November 1990), teach a method for selecting which memory elements in a circuit should be selected to be scan memory elements.

SUMMARY OF THE INVENTION

One aspect of the present invention is a method and apparatus for designing integrated circuits for economical testing while avoiding many of the costs and restrictions associated with prior methods. The principal cost associated with the prior art is that the prior art added test circuitry to integrated circuits in such a way that it slowed the operation of the integrated circuit. Circuits designed with embodiments of the present invention are as easily testable as those in the prior art but usually avoid the performance degradation associated with the prior art.

These results are obtained in an illustrative embodiment of the present invention by chosing memory elements in the circuit to be scan memory elements based on the costs and benefits associated with (1) the scope of fault coverage provided by the scan memory elements, (2) the ease with which test vectors can be generated, (3) the ease with which the test vectors can be applied to the circuit and the resultant vectors retrieved, (4) the total area on the integrated circuit consumed by the scan memory elements, (5) the total area on the integrated circuit consumed by the conductors connecting the scan memory elements, and (6) the performance (timing) degradation caused by the scan memory elements. More specifically, scan memory elements are illustratively chosen based on their respective ability to both break cycles and to do so without affecting the performance characteristics of the circuit.

Another aspect of the present invention is a circuit which enables testing with partial scan techniques and does so with little or no impact on the circuit's performance when it is providing the functionality for which it was designed and fabricated. This accomplished by placing scan memory elements into the circuit in places where the performance degradation associated with scan memory elements does not affect the performance of the circuit as a whole.

DETAILED DESCRIPTION

I. Overview of Detailed Description

The illustrative embodiment of the present invention is a post-processor in a computer-aided design system and advantageously converts a schematic of a circuit which does not provide partial scan testing into a schematic of a circuit which does provide partial scan testing. The detailed description comprises eight sections in addition to this overview. Circuits which enable partial scan testing advantageously conform to the partial scan architecture described in Section II. Section III describes an illustrative technique for testing circuits which conform to the partial scan architecture taught in Section II.

For pedagogical reasons, the illustrative embodiment is described twice. First, as it is applied to circuits in general and, second, as it is applied to an illustrative circuit. The illustrative circuit has been chosen for its ability to highlight aspects of the illustrative embodiment and to provide a specific example of its operation. Section IV describes the illustrative circuit, Section V describes the illustrative embodiment as it is applied to circuits in general, Section VI details the application of the illustrative embodiment to the illustrative circuit, and Section VII describes the illustrative circuit as it is modified in accordance with the illustrative embodiment to conform to the partial scan architecture taught in Section II.

Section VIII presents a description of an illustrative partial scan memory element as it may be used in the modified circuit of Section VII and Section IX describes an illustrative computer-aided design system which incorporates the illustrative embodiment.

II. An Architecture for Partial Scan Circuits

This section presents an illustrative circuit architecture which advantageously enables a circuit to be tested with partial scan techniques. The next section presents an illustrative methodology for testing circuits which conform to this architecture and Sections IV, V and VI teach a methodology for converting circuits which do not conform to this architecture into circuits which do.

Figure 2:
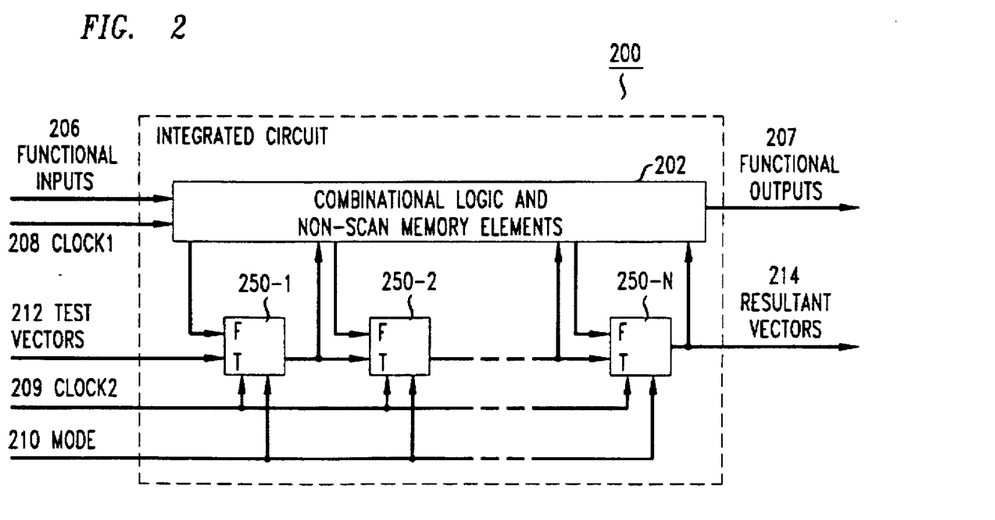
FIG. 2 shows a block diagram of a digital circuit comprising combinational logic, non-scan memory elements and scan memory elements which may be configured into a test mode shift register for the reception of test vectors and outputting of test results.

FIG. 2 shows the layout of integrated circuit 200 which has been advantageously designed in accordance with the illustrative embodiment of the present invention. Integrated circuit 200 comprises combinational logic and memory elements and has two modes of operation: a "function" mode and a "test" mode. In function mode, the combinational logic and memory elements are electrically connected so as to enable the circuit to operate in the manner for which it was designed and fabricated. In test mode, a subset of the memory elements, the "scan memory elements," are electrically insulated from the other memory elements, the "non-scan memory elements," and the combinational logic in the circuit and are reconfigured in a manner so as to facilitate testing.

In integrated circuit 200, the combinational logic and non-scan memory elements are functionally grouped at 202. In accordance with an aspect of the invention, most of the memory elements are non-scan memory elements. The N scan memory elements in circuit 200 are labeled 250-1, 250-2 ... 250-N.

Integrated circuit 200 comprises one or more leads 206 for providing functional data to the circuit and one or more leads 207 for retrieving functional data from the circuit when it is in function mode. Integrated circuit 200 also comprises lead 212 for providing externally generated test vectors to the scan memory elements 250-1, 250-2... 250-N and lead 214 for retrieving resultant vectors from the scan memory elements when the circuit is in test mode.

To enable the scan memory elements to function independently of the non-scan memory elements, a pair of externally generated clock signals, CLOCK1 and CLOCK2, are provided to integrated circuit 200 on leads 208 and 209, respectively. The non-scan memory elements are clocked by CLOCK1 and the scan memory elements are clocked by CLOCK2. When integrated circuit 200 is in function mode, a single externally generated clock signal is provided through leads 208 and 209 to all of the memory elements in circuit 200 so that they all function and are clocked simultaneously. When integrated circuit 200 is in test mode, the externally generated clock signal is provided only to CLOCK2 on lead 209 while lead 208 is held inactive so that only the scan memory elements are clocked.

To control whether integrated circuit 200 is in function mode or in test mode, a MODE signal on lead 210 controls the mode of operation of the circuit. When such a MODE signal is asserted, integrated circuit 200 is put in function mode and thus scan memory elements 250-1, 250-2 ... 250-N operate normally and are influenced by combinational logic and non-scan memory elements 202. When MODE is retracted and no clock is provided on lead 208, circuit 200 is put in test mode such that scan memory elements 250-1, 250-2 ... 250-N are electrically isolated from the influence of the combinational logic and non-scan memory elements 202.

It is preferred that the electrical isolation of the scan memory elements be accomplished by incorporating into each scan memory element a two-to-one multiplexer. Each multiplexer has two data inputs: an "F" (functional) input, a "T" (test) input and a control input which receives the MODE signal on lead 210. When integrated circuit 200 is in function mode, each multiplexer feeds the signal on its F input to its associated memory element and ignores the signal on its T input. When circuit 200 is in test mode, every multiplexer feeds the signal on its T input to its associated memory element and ignores the signal on its F input. The scan memory elements 250-1, 250-2 ... 250-N, may be fabricated as taught by D. K. Bhavsar, U.S. Pat. No. 4,669,061, issued May 26, 1987.

Lead 212, for carrying test vectors into circuit 200 is connected to the T input of scan memory element 250-1 and the output of scan memory element 250-N is connected to lead 214 for retrieving resultant vectors. The output of scan memory elements 250-1, 250-2 ... 250-(N-1) are connected to the T input of scan memory elements 250-2, 250-3 ... 250-N, respectively, so that when circuit 200 is in test mode, the scan memory elements form a shift register with its input on lead 212 and its output on lead 214.

III. A Methodology for Testing Partial Scan Circuits

Testing integrated circuit 200 proceeds as follows. First, scan memory elements 250-1, 250-2 ... 250-N are themselves tested by retracting the MODE signal on lead 210—thus putting circuit 200 into test mode. A test vector is shifted into scan memory elements 250-1, 250-2 ... 250-N via lead 212, and out, via lead 214, to test the ability of each scan memory element to be set and reset. It will be clear to those skilled in the art how to generate this test vector and how to check the resultant vector.

Next, the overall circuit, including combinational logic and non-scan memory elements, is tested by retracting the MODE signal. A test vector is shifted, via lead 212, into scan memory elements 250-1, 250-2 ... 250-N. When the test vector is loaded into scan memory elements 250-1, 250-2 ... 250-N, the MODE signal is asserted—thus putting circuit 200 into function mode. A clock signal is applied on leads 208 and 209 for a predetermined number of clock periods so that the states of the scan memory elements can be affected by combinational logic and non-scan memory elements 202. After the predetermined number of clock periods, the MODE signal on lead 210 is again retracted and with CLOCK2 the states of scan memory elements are shifted out on lead 214. The resultant vector is then compared with that which is expected. It will be clear to those skilled in the art how to generate the test vectors and how to check the corresponding resultant vectors to determine if faults exist in the circuit. This procedure of loading test vectors, operating the circuit in function mode and reading out resultant vectors is repeated with different test patterns until a desired level of fault coverage is achieved.

For the purposes of the illustrative embodiment, the propagation delay associated with scan memory elements is assumed to be greater than for non-scan memory elements based on the difference in the design of the respective circuits. It will be clear to those skilled in the art how to modify embodiments of the claimed invention when the propagation delay associated with scan memory elements is less than or equal to that for non-scan memory elements.

IV. An Illustrative Circuit

An illustrative circuit is presented in this section which provides some desired functionality but does not conform to the partial scan architecture taught in Section II. Techniques for designing circuits like the illustrative circuit are well known to those skilled in the art and form no part of the present invention. Section V presents the conversion methodology for turning non-partial scan circuits (e.g., the illustrative circuit) into partial circuits and Section VI teaches the conversion methodology as it applies to the illustrative circuit In Section VII, the illustrative circuit is shown as it has been modified according to the conversion methodology to conform to the architecture of Section II.

Figure 3:
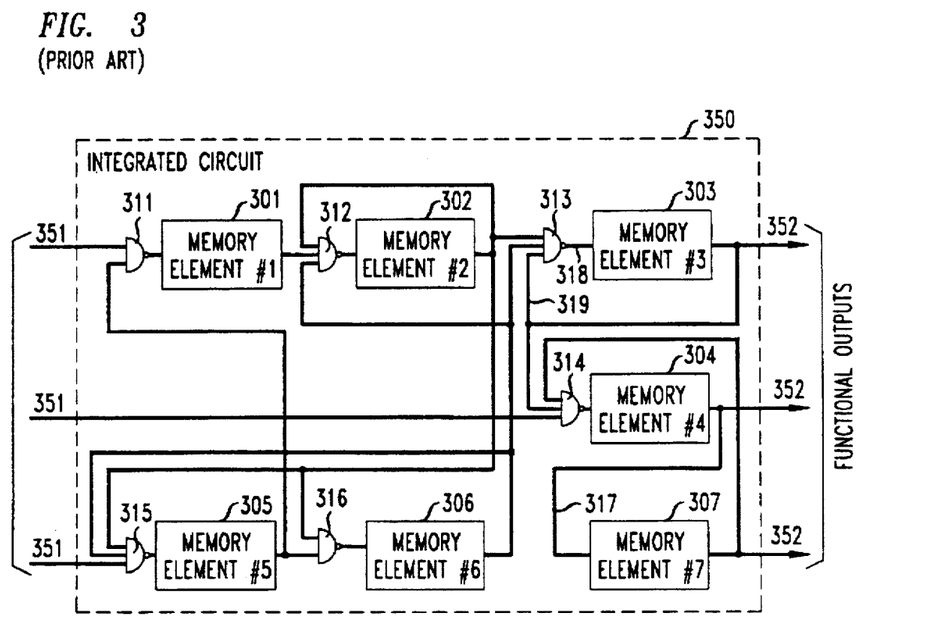
FIG. 3 shows an illustrative digital circuit which does not incorporate partial scan test circuitry.

FIG. 3 shows the schematic of a typical circuit design which will be modified according to the conversion methodology. Circuit 350 comprises seven memory elements 301 through 307, combinational logic elements 311 through 316, and numerous signal paths from the functional output of a memory element, perhaps through a combinational logic element, and into the functional input of a memory element Lead 317 is an example of one signal path which does not go through a combination logic element and leads 318 and 319 are an example of a signal path which does go through a combinational logic element.

The circuit is synchronous and is designed to operate at some "performance metric," e.g., a target frequency. All memory elements are initially controlled by a clock signal (not shown) such as CLOCK1 208 in FIG. 2. Each memory element has associated with it a "performance characteristic," e.g., a quantity called "slack" which is defined as the difference between the circuit's target speed (in temporal units) and the time required for the signal to propagate to the memory element's data input from another memory element and perhaps through combinational logic. For example, when a circuit's target frequency is 100 MHz (i.e., one complete course of recurrent operations every 10 nanoseconds) and the worst-case signal propagation delay along a signal path into a memory element, as determined by a static timing analyzer, is 7 nanoseconds, then that memory element's slack is 3 nanoseconds. Techniques for determining the slack associated a memory element are well known in the an and forms no pan of the present invention. R. B. Hitchcock, Sr., in "Timing Verification and Timing Analysis Program," *Proc. 19th Design Automation Conf.* (1982), teaches a technique for static timing analysis of circuits.

Table 1 presents the illustrative slack values associated with each memory element in the circuit of FIG. 3.

TABLE 1

Static Timing Analysis of Circuit in FIG. 3 ($d_{max} = 2$ ns)

| Memory Element | Slack | Graph Vertex | Weight |
| --- | --- | --- | --- |
| 301 | 3 ns | 401 | 3 |
| 302 | 1 ns | 402 | 1 |
| 303 | 5 ns | 403 | 5 |
| 304 | 1 ns | 404 | 1 |
| 305 | 5 ns | 405 | 5 |
| 306 | 3 ns | 406 | 3 |
| 307 | 3 ns | 407 | 3 |

V. A Methodology for Creating Partial Scan Circuits

One aspect of the present invention involves converting a non-scan circuit design into a partial scan circuit design such that the partial scan circuit, when fabricated, can be tested with partial scan techniques. Advantageously, the scan memory elements are chosen from among the memory elements in the circuit so as, to consider the costs and benefits associated with (1) the scope of fault coverage provided by the scan memory elements, (2) the ease with which test vectors can be generated, (3) the ease with which the test vectors can be applied to the circuit and the resultant vectors retrieved, (4) the total area on the integrated circuit consumed by the scan memory elements, (5) the total area on the integrated circuit consumed by the conductors connecting the scan memory elements, and (6) the performance (timing) degradation caused by the scan memory elements.

The selection of memory elements to be modified to be scan memory elements is facilitated when the circuit to be modified is represented as a weighted directed graph $G=(V, E, W)$. In the graph G a vertex $v_i$ represents memory element i and an edge $(v_i, v_j)$ exists when there is a signal path from memory element i to memory element j. Each vertex has associated with it a weight $w_i$ which is a unitless quantity which directly relates to the slack associated with the corresponding memory element i.

Figure 4:
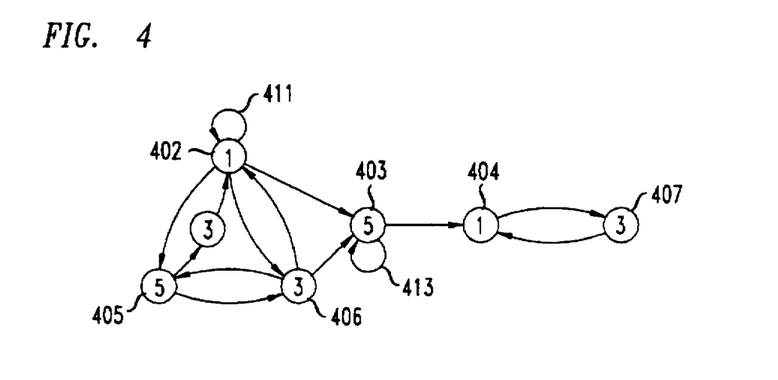
FIG. 4 shows a weighted directed graph which represents the digital circuit represented by FIG. 3.

The circuit of FIG. 3 is illustratively represented by the weighted directed graph shown in FIG. 4. Vertex 40n in FIG. 4 represents memory element 30n from FIG. 3. Each memory element in the circuit is represented by a vertex in the graph and the direction of signal flow through the combinational logic elements and the interdependence of the memory elements is represented by the graph's edges. As a corollary, an edge between two vertices indicates that there exists a signal path between the memory elements associated with those vertices. Only the memory elements and the combinational logic dependencies between memory elements are represented in the graph of FIG. 4. As shown in FIG. 4, the number shown inside a vertex denotes the weight associated with that vertex. Table 1 shows the mapping of the memory elements of FIG. 3 to the vertices of FIG. 4 and the respective slacks associated with the circuit of FIG. 3 to the weights of the graph in FIG. 4. It will be clear to those skilled in the art how to construct a weighted directed graph, like that shown in FIG. 4, from a circuit schematic, like than shown in FIG. 3.

In an illustrative embodiment of the present invention, memory elements are advantageously chosen to be scan memory elements based on their ability to break some or all of the cycles in the circuit which have a length longer than some threshold. When a memory element f is selected to be convened into a scan memory element, extra circuitry is added to the memory element which causes extra propagation delay along the signal paths which end at memory element f. The amount of extra delay caused by the extra circuitry in a scan memory element is roughly fixed by the fabrication technology and is approximately equal to the delay of a two-to-one multiplexer. For the purposes of this specification, this delay is denoted as $d_{max}$. Techniques for determining $d_{max}$ are well known to those skilled in the art and form no part of the present invention. The actual propagation delay incurred in converting a memory element into a scan memory element differs depending on the impedance of the specific signal path. In the illustrative embodiment, however, the delays due to variances in impedance are typically small and are neglected.

When a memory element is chosen in the course of design to be converted into a scan memory element and that memory element has slack equal to or greater than $d_{max}$, it is guaranteed that no performance degradation will be caused by this selection. When, however, a memory element is chosen to be converted into a scan memory element and that memory element has slack less than $d_{max}$, in the absence of other performance optimization steps, the circuit's performance will be degraded because the signal coming into the memory element will not be stable before the memory element's set-up time. According to an embodiment of the present invention, memory elements are chosen to be scan memory elements based on the ability of the respective memory element to break a cycle and to do so with little or no performance degradation.

In practice, neither fault coverage nor ease of testing suffer when self-loops (i.e., cycles of length one) are not broken. And since the number of self-loops in a circuit is typically very high, it may be advantageous to break only cycles of length greater than one. In accordance with an illustrative embodiment of the invention, memory elements in the circuit of FIG. 3 will chosen based on the necessity of breaking circuit cycles of greater than length one and on the ability to do so with minimum impact on performance.

Figure 5:
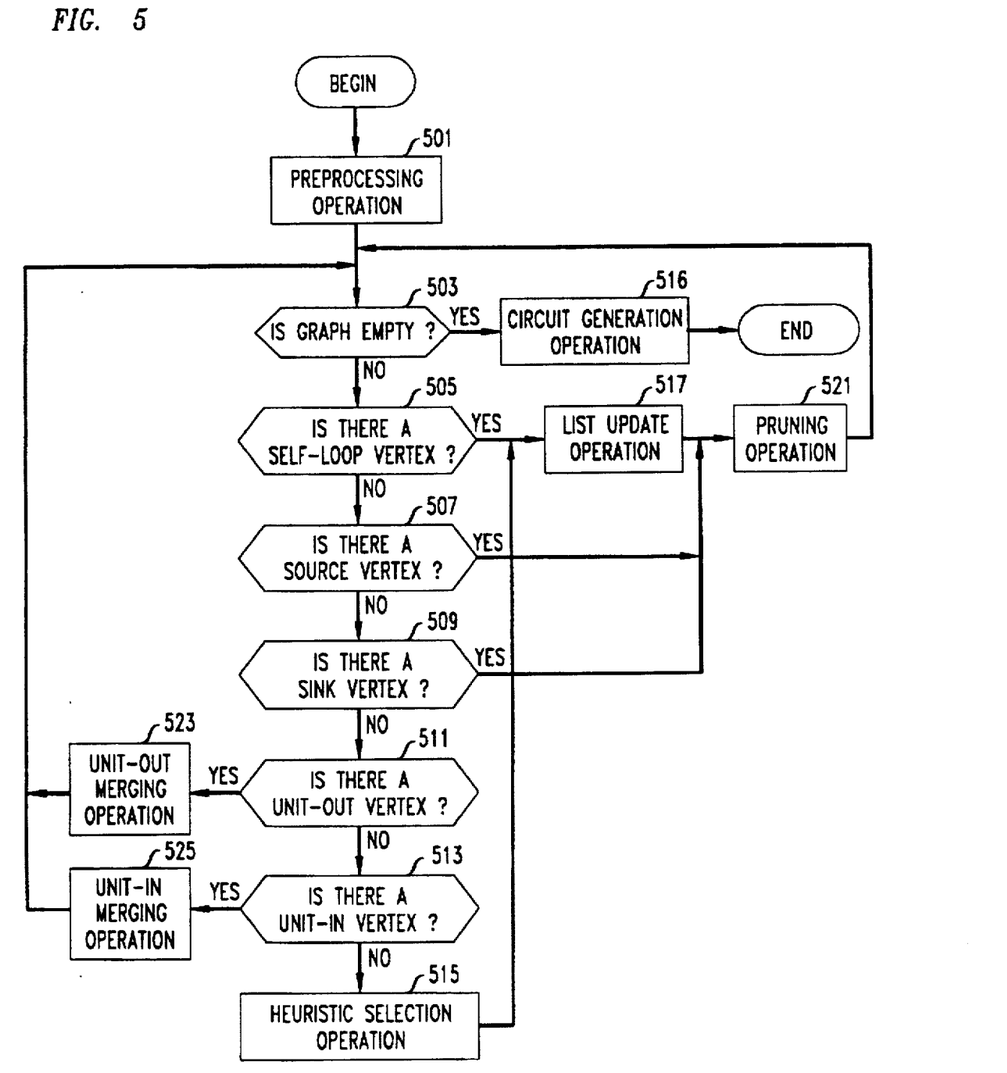
FIG. 5 shows a flowchart for a technique which determines which memory elements in a circuit may be selected as scan memory elements.

FIG. 5 shows a flowchart of a technique suitable for practice on a computer which selects those vertices in a weighted directed graph which represent those memory elements in a circuit which are advantageously made scan memory elements. It is to be understood, however, that neither the automation of this technique nor the use of this technique at all is essential to practice embodiments of the present invention. The technique involves iteratively examining, manipulating and pruning the graph until the graph is empty (i.e., void of vertices).

As shown in FIG. 5, the technique advantageously begins with a "preprocessing operation" (block 501) which processes the weighted directed graph (the "graph") representing the circuit to be modified by removing all of the edges from the graph which cause "self-loops". For the purpose of this specification, a self-loop is defined a vertex which has an edge which both begins and terminates on the vertex.

The preprocessing operation (block 501) implements the decision, made earlier, to break only cycles of greater than length one. When, alternatively, the decision is made to break all of the cycles in the graph, regardless of length, then the preprocessing operation (block 501) should be omitted. Similarly, when the decision is made to break only those cycles of greater than some length n, then the preprocessing operation (block 501) should modified to remove from the graph all loops in the graph of length n or less. It will be clear to those skilled in the art how to modify the preprocessing operation to accommodate these different decisions.

As shown in FIG. 5, when the preprocessing operation is complete, control passes to an "empty graph" test (block 503) which determines whether the current graph is empty (i.e., void of vertices). When the graph is empty, control passes to the "circuit generation" operation (block 516). The circuit generation operation generates the output circuit schematic based on the input circuit schematic and on one or more "scan vertices" (e.g., a scan memory element list). After the circuit generation operation, the technique ends. When the empty graph test (block 503) determines that the graph is not empty, control passes to a "self-loop" test (block 505).

The self-loop test (block 505) determines whether there is a self-loop in the current graph. When a vertex having a self-loop is identified in the current graph, control passes to the "list update operation" (block 517)—otherwise, control passes to the "source vertex test" (block 507).

The list update operation (block 517) adds the identified vertex (i.e., a scan vertex) to a list of vertices which represent memory elements which advantageously should be made scan memory elements. When the list update operation is complete, control passes to a "pruning operation" (block 521) which updates the graph by removing the identified vertex from the graph and all of the edges which either begin or end on the identified vertex. When the pruning operation (block 521) is complete, control passes back to the empty graph test (block 503).

The source vertex test (block 507) determines whether there is a "source vertex" in the current graph. For the purpose of this specification, a source vertex is defined as a vertex from which one or more edges begin but on which no edges end. When a source vertex is identified in the current graph, control passes to the pruning operation (block 521) —otherwise, control passes to a "sink vertex" test (block 509).

The sink vertex test (block 509) determines whether there is a "sink vertex" in the current graph. For the purpose of this specification, a sink vertex is defined as a vertex on which one or more edges end but from which no edges begin. When a sink vertex is identified in the current graph, control passes to the pruning operation (block 521)—otherwise, control passes to a "unit-out" test (block 511).

The unit-out test (block 511) determines whether there is a "unit-out vertex" in the current graph. For the purpose of this specification, a "tail vertex" is defined as a vertex from which an edge begins, a "successor vertex" is defined as a vertex on which an edge ends, and a unit-out vertex is defined as a tail vertex (1) from which exactly one edge begins, and (2) whereby the successor vertex, pointed to by that one edge, has a weight which is equal to or greater than $d_{max}$. When a unit-out vertex is identified in the current graph, control passes to a "unit-out merging operation" (block 523)—otherwise, control passes to a "unit-in test" (block 513).

The unit-out merging operation (block 523) merges the unit-out vertex into the successor vertex by (1) removing the unit-out vertex and the edge beginning on the unit-out vertex from the graph and (2) by reterminating any and all edges which end on the unit-out vertex on the successor vertex. Once the unit-out merging operation (block 523) is complete, control passes back to the empty graph test (block 503).

The unit-in test (block 513) determines whether there is a "unit-in vertex" in the current graph. For the purpose of this specification, a unit-in vertex is defined as a successor vertex (1) on which exactly one edge ends, and (2) whereby the tail vertex, the source of the edge, has a weight which is equal to or greater than $d_{max}$. When a unit-in vertex is identified in the current graph, control passes to a "unit-in merging operation" (block 525)—otherwise, control passes to a "heuristic selection operation" (block 515).

The unit-in merging operation (block 525) merges the unit-in vertex into the tail vertex by (1) removing the unit-in vertex and the edge ending on the unit-in vertex from the graph and (2) by moving the tail of any and all edges which begin on the unit-in vertex to the tail vertex. Once the unit-in merging operation (block 525) is complete, control passes back to the empty graph test (block 503).

The heuristic selection operation (block 515) identifies a vertex in the graph which is to be added to the scan memory element list. The heuristic selection operation (block 515) is needed to alleviate a graph whose topology cannot be handled by the other graph manipulation and pruning operations.

The heuristic selection operation (block 515) has a primary heuristic and a backup heuristic. The primary heuristic is tried first and attempts to identify a single vertex i (from all of the vertices remaining in the updated graph) which has (1) a weight greater than or equal to $d_{max}$ and (2) which has a uniquely maximum value—no ties allowed—of:

$$fanin_i \times fanout_i + C \times w_i$$

where "*fanin $_i$*" equals the number of edges which end on vertex i and "*fanout$_i$*" equals the number of edges which begin on vertex i. In general, this heuristic is based on the notion that removing a vertex with a large number of incoming and outgoing nodes will eliminate a relatively large number of cycles.

When the primary heuristic is unable to identify a unique vertex which satisfies its criteria (meaning that all of the vertices in the graph have a weight less than $d_{max}$ or that two or more vertices tie), the backup heuristic identifies a vertex i (from all of the vertices remaining in the updated graph) which has the maximum value (in comparison to all of the other vertices in the updated graph) of:

$$fanin_i \times fanout_i + C \times w_i$$

where "C" is a constant and "$w_i$" is the weight associated with vertex i. When the backup heuristic identifies two or more vertices with the maximum value, the backup heuristic randomly identifies one of those with the maximum value.

When C is assigned a large value (e.g., greater than the maximum $fanin_i \times fanout_i$) the backup heuristic will identify the vertex with the greatest weight. When, however, C is assigned a small value (e.g., zero) the backup heuristic will identify the vertex with the greatest product of $fanin_i \times fanout_i$. In the preferred embodiment, C is assigned a unit-less value which is the product of the average *fanin* times the average *fanout* in the original unpruned graph. When either the primary or backup heuristic in the heuristic selection operation (block 515) identifies a vertex, control passes to the list update operation (block 519).

VI. Application of Methodology to Illustrative Circuit

The application of the selection technique shown in FIG. 5 to the illustrative circuit shown in FIG. 3 will now be presented. As discussed above, the weighted directed graph shown in FIG. 4 represents the illustrative circuit shown in FIG. 3.

The technique of FIG. 5 requires a scan memory element list which, when the technique is complete, will contain a list of the vertices which represent those memory elements in the circuit of FIG. 3 which advantageously should be made scan memory elements. Before processing begins, the scan memory element list is empty. See Table 2.

TABLE 2

| Scan Memory Element List Before Processing Begins |
|---|
| Scan Memory Element List |
| ∅ |

As shown in FIG. 5, the technique advantageously begins with the preprocessing operation (block 501) which processes the graph by removing all of the edges from the graph which cause self-loops. By examining the graph in FIG. 4, it can be seen that the graph has two self-loops: one associated with vertex 402 and the second associated with vertex 403. Therefore, the preprocessing operation (block 501) removes edges 411 and edge 413 from the current graph to create the pruned graph shown in FIG. 6. Because the preprocessing operation is complete, control passes to the graph empty test (block 503).

Figure 6:
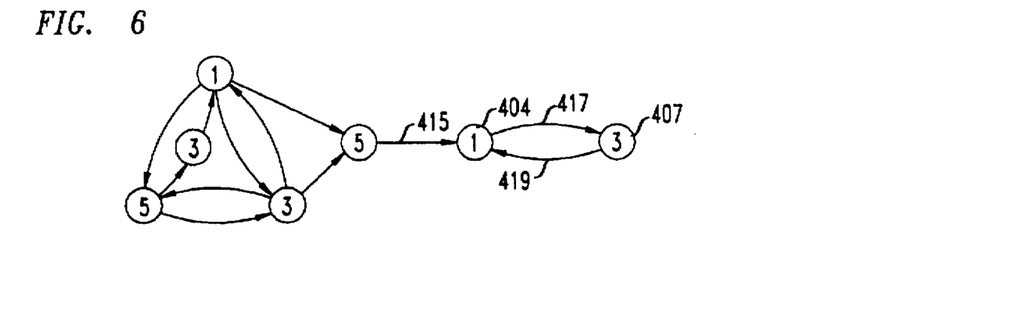
FIG. 6 shows the weighted directed graph of FIG. 4 which has been pruned by the technique represented by the flowchart in FIG. 5.

By examining the current pruned graph in FIG. 6, it can be seen that the graph is not empty (because there are vertices remaining in the graph). Therefore, the empty graph test (block 503) fails and control passes to the self-loop test (block 505). By examining the current pruned graph in FIG. 6, it can be seen that the graph does not contain any self-loops. Therefore, the self-loop test (block 505) fails and control passes to the source vertex test (block 507).

By examining the current pruned graph in FIG. 6, it can be seen that the graph does not contain any source vertices. Therefore, the source vertex test (block 507) fails and control passes to the sink vertex test (block 509). By examining the current pruned graph in FIG. 6, it can be seen that the graph does not contain any sink vertices. Therefore, the sink vertex test (block 509) fails and control passes to the unit-out vertex test (block 511).

By examining the current pruned graph in FIG. 6, it can be seen that the graph does indeed contain a unit-out vertex, vertex 404. While the graph in FIG. 6 may have more than one unit-out vertex, the test (block 511) only identifies one per iteration. Therefore, the unit-out vertex test (block 511) is satisfied and control passes to the unit-out merging operation (block 523).

Figure 7:
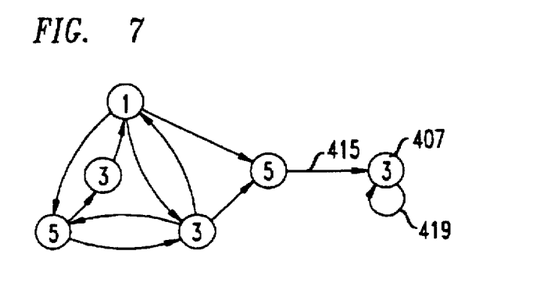
FIG. 7 shows the weighted directed graph of FIG. 6 which has been pruned by the technique represented by the flowchart in FIG. 5.

The unit-out merging operation removes the unit-out vertex 404 and the unit-out edge 417 from the graph and reterminates edges 415 and 419 on successor vertex 407 to mate the newly updated graph shown in FIG. 7. Because the unit-out merging operation (block 523) is complete, control passes to the empty graph test (block 503).

By examining the current pruned graph in FIG. 7, it can be seen that the graph is not empty. Therefore, the empty graph test (block 503) fails and control passes to the self-loop test (block 505). By examining the current pruned graph in FIG. 7, it can be seen that vertex 407 can be identified as a vertex with a self-loop. Therefore, the self-loop test (block 505) is satisfied and control passes to the list update operation (block 517).

The list update operation (block 517) adds vertex 407 to the scan memory element list which is shown in Table 3.

TABLE 3

| Scan Memory Element List After First Update |
|---|
| Scan Memory Element List |
| Vertex 407 |

Figure 8:
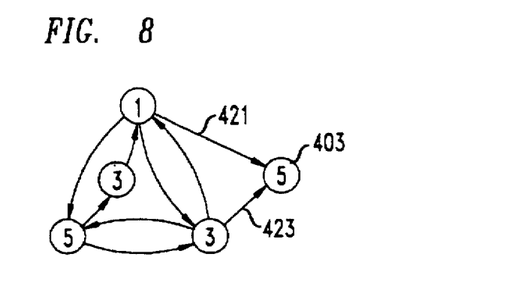
FIG. 8 shows the weighted directed graph of FIG. 7 which has been pruned by the technique represented by the flowchart in FIG. 5.

After the list update operation (block 517) has been completed, control passes to the pruning operation (block 521) which removes vertex 407 and edges 415 and 419 from the graph in FIG. 7 to create the newly updated graph in FIG. 8. When the pruning operation (block 521) is complete, control passes back to the empty graph test (block 503).

By examining the current pruned graph in FIG. 8, it can be seen that the graph is not empty. Therefore, the empty graph test (block 503) fails and control passes to the self-loop test (block 505). By examining the current pruned graph in FIG. 8, it can be seen that the graph does not contain any self-loops. Therefore, the self-loop test (block 505) fails and control passes to the source vertex test (block 507).

By examining the graph in FIG. 8, it can be seen that the graph does not contain any source vertices. Therefore, the source vertex test (block 507) fails and control passes to the sink vertex test (block 509). By examining the graph in FIG. 8, it can be seen that a sink vertex, vertex 403, can be identified in the graph. Therefore, the sink vertex test (block 509) is satisfied and control passes to the pruning operation (block 521).

Figure 9:
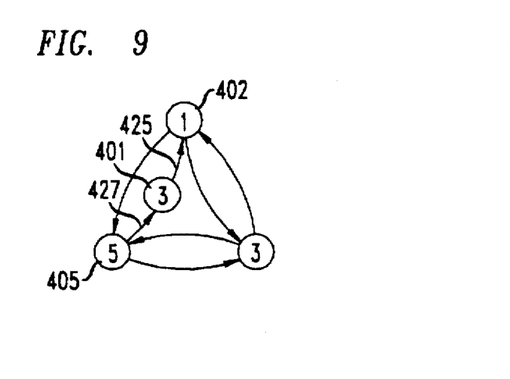
FIG. 9 shows the weighted directed graph of FIG. 8 which has been pruned by the technique represented by the flowchart in FIG. 5.

The pruning operation (block 521) removes sink vertex 403 and edges 421 and 423 from the graph in FIG. 8 to create the newly updated graph in FIG. 9. When the pruning operation (block 407) is complete, control passes back to the empty graph test (block 503).

By examining the current pruned graph in FIG. 9, it can be seen that the graph is not empty. Therefore, the empty graph test (block 503) fails and control passes to the self-loop test (block 505). By examining the current pruned graph in FIG. 9, it can be seen that the graph does not contain any self-loops. Therefore, the self-loop test (block 505) fails and control passes to the source vertex test (block 507).

By examining the current pruned graph in FIG. 9, it can be seen that the graph does not contain any source vertices. Therefore, the source vertex test (block 507) fails and control passes to the sink vertex test (block 509). By examining the current pruned graph in FIG. 9, it can be seen that the graph does not contain any sink vertices. Therefore, the sink vertex test (block 509) fails and control passes to the unit-out vertex test (block 511).

By examining the current pruned graph in FIG. 9, it can be seen that the graph does not contain a unit-out vertex. It should be remembered that while vertex 401 satisfies the first prong of the unit-out vertex test, it fails the second prong because vertex 402, the successor vertex, has a weight which is less than $d_{max}$. Therefore, the unit-out vertex test (block 511) fails and control passes to the unit-in vertex (block 513) test.

By examining the current pruned graph in FIG. 9, it can be seen that the graph does indeed contain a unit-in vertex, vertex 401. Therefore, the unit-in vertex test (block 513) is satisfied and control passes to the unit-in merging operation (block 525).

Figure 10:
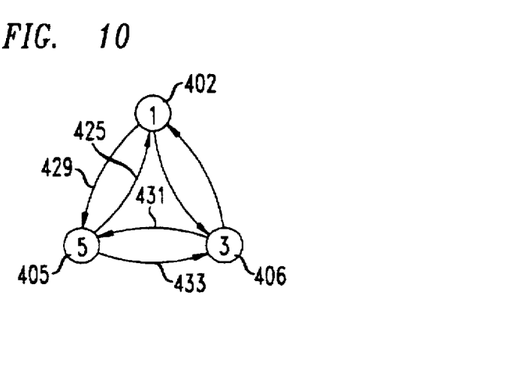
FIG. 10 shows the weighted directed graph of FIG. 9 which has been pruned by the technique represented by the flowchart in FIG. 5.

The unit-in merging operation removes the unit-in vertex 401 and the unit-in edge 427 from the graph and retermi­nates edge 425 on tail vertex 405 to create the newly updated graph shown in FIG. 10. Because the unit-in merging operation (block 525) is complete, control passes to the empty graph test (block 503).

By examining the current pruned graph in FIG. 10, it can be seen that the graph is not empty. Therefore, the empty graph test (block 503) falls and control passes to the self-loop test (block 505). By examining the current pruned graph in FIG. 10, it can be seen that the graph does not contain any self-loops. Therefore, the self-loop test (block 505) falls and control passes to the source vertex test (block 507).

By examining the graph in FIG. 10, it can be seen that the graph does not contain any source vertices. Therefore, the source vertex test (block 507) falls and control passes to the sink vertex test (block 509). By examining the current pruned graph in FIG. 10, it can be seen that the graph does not contain any sink vertices. Therefore, the sink vertex test (block 509) falls and control passes to the unit-out vertex test (block 511).

By examining the current pruned graph in FIG. 10, it can be seen that the graph does not contain any unit-out vertices. Therefore, the unit-out vertex test (block 511) fails and control passes to the unit-in vertex test (block 513). By examining the current pruned graph in FIG. 10, it can be seen that the graph does not contain any unit-in vertices. Therefore, the unit-in vertex test (block 513) falls and control passes to the heuristic selection operation (block 515).

The primary heuristic of the heuristic selection operation (block 515) attempts to identify a single vertex remaining in the graph of FIG. 10 which has a weight greater that $d_{max}$ (which is illustratively two for the circuit of FIG. 3) and which has the maximum value of $fanin_i \times ffanout_i$. Table 5 lists each vertex in the graph of FIG. 10, its $fanin$, $fanout$, and the product of $fanin$ and $fanout$.

TABLE 5

Results of Primary Heuristic
as Applied to Graph in FIG. 10 ($d_{max} = 2$).
Primary Heuristic Results

| Vertex | Weight | fanin | fanout | fanin × fanout |
|---|---|---|---|---|
| 402 | 1 | — | — | — |
| 405 | 5 | 2 | 2 | 4 |
| 406 | 3 | 2 | 2 | 4 |

From Table 5 it can be seen that vertex 402 is not considered because it has a weight which is less than $d_{max}$. It can also be seen in Table 5 that neither of the remaining vertices can be selected because each has a $fanin \times fanout$ value equal to that of the other. Therefore, the primary heuristic is advantageously avoided in favor of the backup heuristic.

The backup heuristic of the heuristic selection operation (block 515) identifies a single vertex remaining in the graph of FIG. 10 which has the greatest value of $fanin_i \times fanout_i + C \times w_i$. By examining the original unpruned graph in FIG. 4, a value for the constant C can be determined. Table 6 lists each vertex in the graph of FIG. 4 and illustrates the process for determining the value of C.

TABLE 6

Calculation of Backup Heuristic Constant
as Applied to Graph in FIG. 4..
Backup Heuristic Constant

| Vertex | fanin | fanout | Product |
|---|---|---|---|
| 401 | 1 | 1 | — |
| 402 | 3 | 4 | — |
| 403 | 3 | 2 | — |
| 404 | 2 | 1 | — |
| 405 | 2 | 2 | — |
| 406 | 2 | 3 | — |
| 407 | 1 | 1 | — |
| Average | 2 | 2 | C = 4 |

In accordance with the backup heuristic, Table 7 lists each vertex i in the graph of FIG. 10, its weight, $fanin$, $fanout$, and the value $fanin_i \times fanout_i + C \times w_i$.

TABLE 7

Results of Backup Heuristic
as Applied to Graph in FIG. 10 (C = 4).
Backup Heuristic Results

| Vertex | Weight | fanin | fanout | Value |
|---|---|---|---|---|
| 402 | 1 | 2 | 2 | 8 |
| 405 | 5 | 2 | 2 | 24 |
| 406 | 3 | 2 | 2 | 16 |

From Table 7 it can be seen that the backup heuristic has identified vertex 405 from all of the vertices remaining in FIG. 10 and therefore control passes to the list update operation (block 517).

The list update operation (block 517) adds vertex 405 to the scan memory element list which is shown in Table 8.

TABLE 8

Scan Memory Element List After Second Update

Scan Memory
Element List

Vertex 407
Vertex 405

Figure 11:
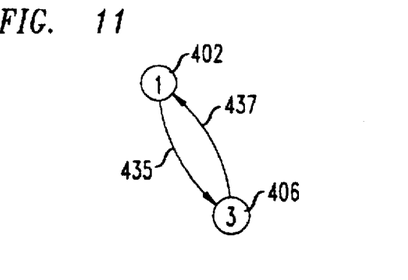
FIG. 11 shows the weighted directed graph of FIG. 10 which has been pruned by the technique represented by the flowchart in FIG. 5.

After the list update operation (block 517) has been completed, control passes to the pruning operation (block 521) which removes vertex 405 and edges 429, 425, 431 and 433 from the graph in FIG. 10 to create the newly updated graph in FIG. 11. When the pruning operation (block 521) is complete, control passes back to the empty graph test (block 503).

By examining the current pruned graph in FIG. 11, it can be seen that the graph is not empty. Therefore, the empty graph test (block 503) fails and control passes to the self-loop test (block 505). By examining the graph in FIG. 11, it can be seen that the graph does not contain any self-loops. Therefore, the self-loop test (block 505) fails and control passes to the source vertex test (block 507).

By examining the graph in FIG. 11, it can be seen that the graph does not contain any source vertices. Therefore, the source vertex test (block 507) fails and control passes to the sink vertex test (block 509). By examining the current pruned graph in FIG. 11, it can be seen that the graph does not contain any sink vertices. Therefore, the sink vertex test (block 509) fails and control passes to the unit-out vertex test (block 511).

By examining the current pruned graph in FIG. 11, it can be seen that the graph does indeed contain a unit-out vertex, vertex 402. Therefore, the unit-out vertex test (block 511) is satisfied and control passes to the unit-out merging operation (block 523).

Figure 12:
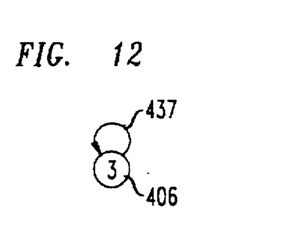
FIG. 12 shows the weighted directed graph of FIG. 11 which has been pruned by the technique represented by the flowchart in FIG. 5.

The unit-out merging operation removes the unit-out vertex 402 and the unit-out edge 435 from the graph and reterminates edge 437 on successor vertex 406 to create the newly updated graph shown in FIG. 12. Because the unit-out merging operation (block 523) is complete, control passes to the empty graph test (block 503).

By examining the current pruned graph in FIG. 12, it can be seen that the graph is not empty (because there are vertices remaining in the graph). Therefore, the empty graph test (block 503) fails and control passes to the self-loop test (block 505). By examining the current pruned graph in FIG. 12, it can be seen that vertex 407 can be identified as a vertex with a self-loop. Therefore, the self-loop test (block 505) is satisfied and control passes to the list update operation (block 517).

The list update operation (block 517) adds vertex 406 to the scan memory element list which is shown in Table 9.

TABLE 9

Scan Memory Element List After Third Update

Scan Memory Element List

Vertex 407
Vertex 405
Vertex 406

After the list update operation (block 517) has been completed, control passes to the pruning operation (block 521) which removes vertex 406 and edge 437 from the graph in FIG. 7 to obliterate the graph. When the pruning operation (block 407) is complete, control passes back to the empty graph test (block 503).

Because the last vertex in the graph as been pruned, the graph is empty and therefore, the empty graph test (block 503) is satisfied and control passes to circuit generation operation (block 516). Using techniques well known to those skilled in the art, the circuit generation operation generates the output circuit schematic (350 in FIG. 13) based on the input circuit schematic (350 in FIG. 3) and on the scan memory element list (Table 9). Thereafter, the technique is finished.

VII. The Modified Illustrative Circuit

Figure 13:
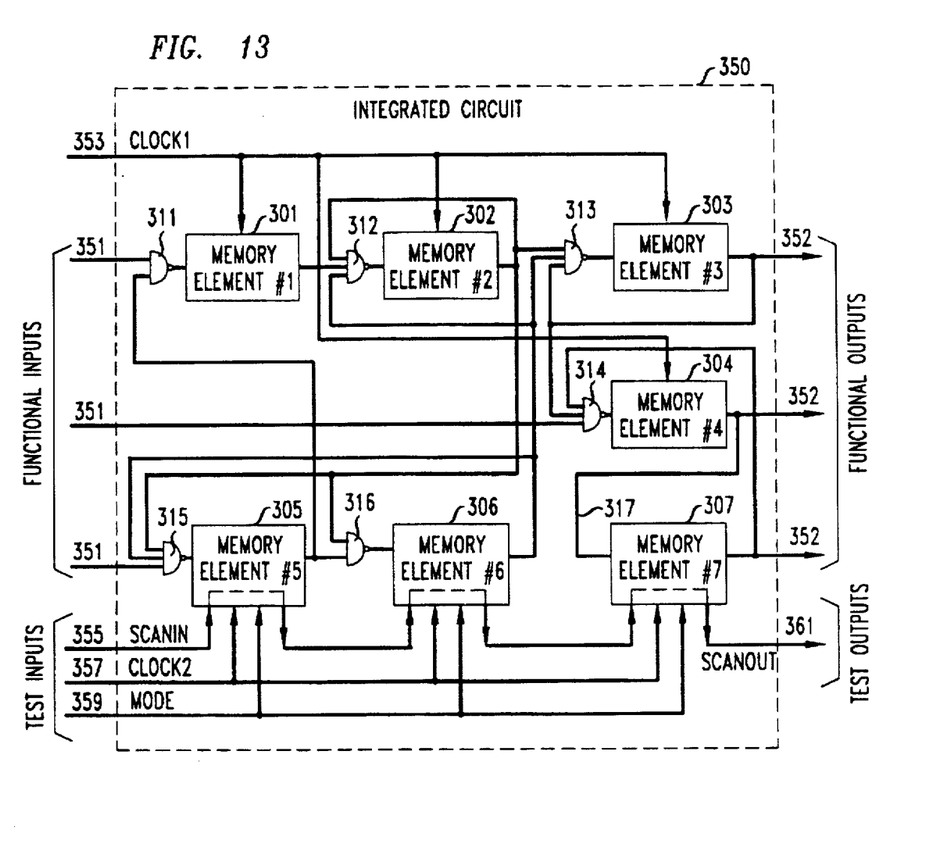
FIG. 13 shows a schematic of the circuit in FIG. 3 as it has been modified according to the technique represented in FIG. 5 to incorporate partial scan test logic.

FIG. 13 shows a schematic 350 of the circuit of FIG. 3 as it has been modified according to Table 1 and Table 9 to conform with the general architecture shown in FIG. 2. Memory elements 305, 306 and 307 have been modified to be scan memory elements while memory elements 301, 302, 303 and 304 have been left unchanged.

CLOCK1, on lead 353, controls non-scan memory elements 301, 302, 303 and 304 and CLOCK2, on lead 357, controls scan memory elements 305, 306 and 307. The scan memory elements are serially connected so that the SCANIN signals, on lead 355, can be injected into the scan memory elements and so that the SCANOUT signals may be retrieved on lead 361. The mode signal, on lead 359 which controls whether the circuit is in test mode or function mode, is connected to the scan memory elements. The circuit of FIG. 13 requires two separate clock signals, which undersirably adds an additional clock pin to an integrated circuit to accommodate the second clock signal.

VIII. An Illustrative Partial Scan Memory Element

Figure 14:
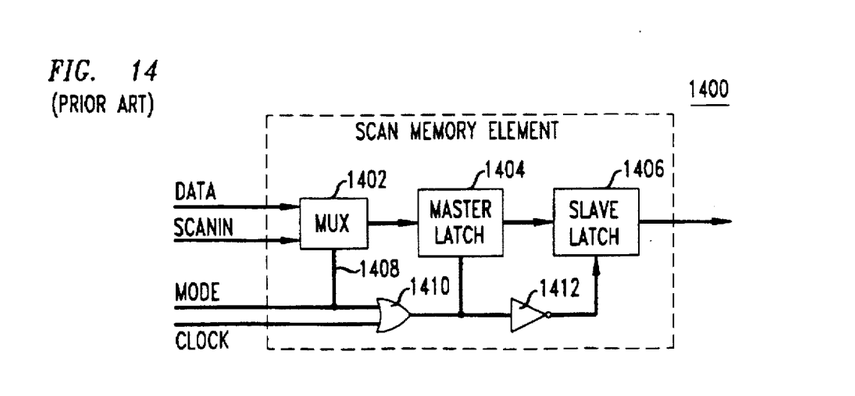
FIG. 14 shows a schematic of an illustrative design for a scan memory element.

FIG. 14 shows a scan memory element 1400 which advantageously requires only one clock, and thus allows the extra clock pin to be eliminated. Non-scan memory elements do not contain the multiplexer 1402 or the OR gate 1410. The CLOCK signal is muted to all scan and non-scan memory elements of a circuit. The MODE signal is muted only to scan memory elements. For non-scan memory elements, the DATA signal directly feeds into the master latch 1404 and the CLOCK signal directly goes to the master latch and the inverter 1412. The same is true in function for scan memory elements for normal operation when MODE is held low. In non-test mode, the CLOCK signal is pulsed and the MODE signal is held low. This causes all scan and non-scan memory elements to accept data on the DATA input. In test mode, the MODE signal is pulsed while the CLOCK signal is held low. Since non-scan memory elements do not receive the MODE signal, the states of these memory elements are not affected when test data is injected into the scan memory elements under control of the MODE signal. However, for scan memory elements, the multiplexer 1402 is controlled by the MODE signal appearing at 1408 to select signals from its SCANIN input. In either test or non-test mode, the signals selected by multiplexer 1402 are passed to a flip-flop consisting of a master latch 1404 and a slave latch 1406. The master and slave latches are controlled by either the CLOCK or the MODE signals via an OR gate 1410 and an inverter 1412.

IX. A Computer-Aided Design System

Figure 15:
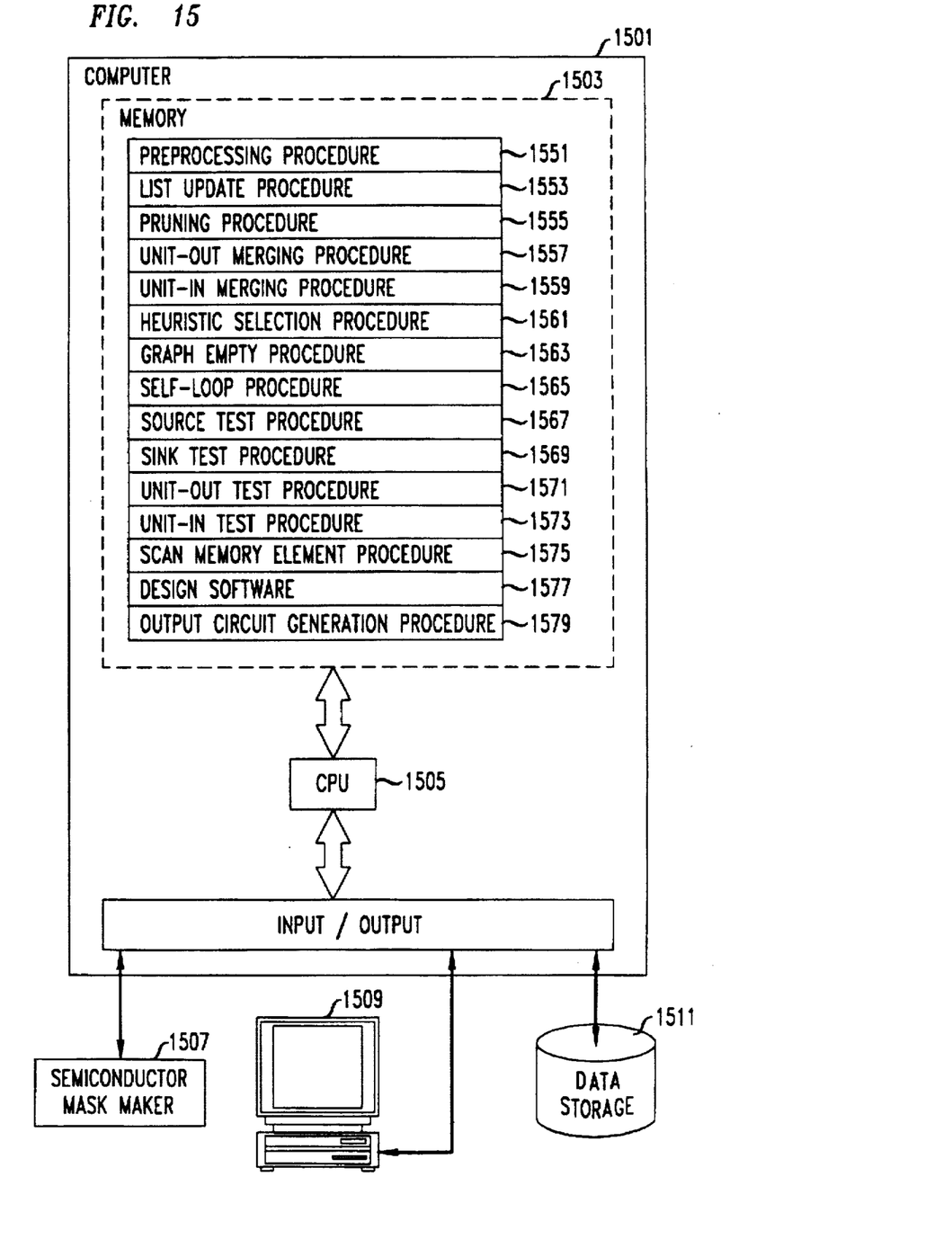
FIG. 15 shows a diagram of a computer-aided design system which is capable of designing the circuits in FIGS. 2 and 13.

FIG. 15 shows a schematic drawing of an illustrative computer-assisted design ("CAD") system which is capable of designing the circuits of FIGS. 2 and 13. The system advantageously comprises a computer 1521 connected to terminal 1509, a storage device 1511 and a machine which makes semiconductor masks. The computer 1521 comprises a central processing unit ("CPU") 1505 and memory 1503. Memory 1503 advantageously contains several procedures which carry out those steps outlined in the flowchart of FIG. 5. It will be clear to those skilled in the art how to code these procedures. An operator via terminal 1509 can design a circuit using computer 1501 and data storage 1511. Computer 1501 can then be used to drive semiconductor mask maker 1507. It is to be understood that the above described arrangements are merely illustrative of the application of principles of the invention and that other arrangements may be devised by workers skilled in the an without departing from the spirit and scope of the invention.

What is claimed is: 1. A method for making a semiconductor mask based on an input circuit topology that is stored in a memory of a computer, which circuit is characterized by

(1) a performance criterion, and (2) a plurality of memory elements, each having a performance characteristic, a functional input and a functional output, and interconnected by a plurality of signal paths in a given topology;

said method comprising:

modifying at least one of said memory elements in said circuit to incorporate partial scan testing circuitry to produce a modified circuit stored in said computer memory, said step of modifying based on said respective performance characteristics of said memory elements, said topology and said performance criterion;

transmitting signals representative of the modified circuit to a semiconductor mask maker; and making a semiconductor mask with said mask maker based on said transmitted signals.

2. An apparatus for making a semiconductor mask based on a circuit, which circuit is characterized by (1) a performance criterion, and (2) a plurality of memory elements, each having a performance characteristic, a functional input and a functional output, and interconnected by a plurality of signal paths in a given topology;

said apparatus comprising:

means for modifying at least one of said memory elements in said circuit to incorporate partial scan testing circuitry to produce a modified circuit, said memory elements selected based on said respective performance characteristics of said memory elements, said topology and said performance criterion;

a semiconductor mask maker; and means for driving said semiconductor mask maker to produce a mask that corresponds to said modified circuit.

3. A method for selecting at least one memory element in an integrated circuit design to have scan testing circuitry associated with said memory element, said integrated circuit having a plurality of memory elements interconnected in a given topology and having a performance criterion, said method comprising:

loading a representation of said integrated circuit into a memory of a computer, said representation comprising for each memory element:

a vertex signal identifying said memory element, a weight signal representing a performance characteristic of said memory element, and at least one edge signal representing a signal path from said memory element to another memory element;

generating at least one scan vertex signal based on said vertex signals, said edge signals, said weight signals and said performance criterion, each of said scan vertex signals representing a memory element to be associated with said scan testing circuitry; and generating a second design for said integrated circuit, which includes said scan testing circuitry, based on said first set of signals and said scan vertex signals.

4. The method of claim 3, wherein said step of generating at least one scan vertex signal comprises the step of identifying one of said vertex signals as a self-loop vertex.

5. The method of claim 3, wherein said step of generating at least one scan vertex signal comprises the step of identifying one of said vertex signals as a source vertex.

6. The method of claim 3, wherein said step of generating at least one scan vertex signal comprises the step of identifying one of said vertex signals as a sink vertex.

7. The method of claim 3, wherein said step of generating at least one scan vertex signal comprises the step of identifying one of said vertex signals as a unit-out vertex.

8. The method of claim 3, wherein said step of generating at least one scan vertex signal comprises the step of identifying one of said vertex signals as a unit-in vertex.

9. An integrated circuit having a performance criterion, said integrated circuit comprising:

an input;

an output;

a plurality of memory elements responsive to a signal at said input and interconnected by a plurality of signal paths in a given topology to produce a signal at said output, said integrated circuit having a performance characteristic; and at least one of said memory elements having associated partial scan testing circuitry operable to receive a test input, said memory element selected based on said respective performance characteristics of said memory elements, said topology and said performance criterion such that said integrated circuit achieves an acceptable level of said performance criterion with the addition of said scan testing circuitry.

10. An integrated circuit, comprising:

a plurality of memory elements each having a performance characteristic interconnected by a plurality of signal paths in a topology; and scan testing circuitry associated with at least one of said memory elements, said memory element selected by processing an electronically stored representation of a first design of said integrated circuit with a computer to select said memory element based on said respective performance characteristics of said semiconductor elements, said topology and a performance criterion of said integrated circuit such that associating said scan testing circuitry with said memory element produces an acceptable level of said performance criterion for said integrated circuit.

11. A method for making a semiconductor mask for an integrated circuit, said method comprising the steps of:

transmitting signals representative of the integrated circuit to a semiconductor mask maker, said signals generated on a computer from data representing a topology of said integrated circuit wherein said computer selects at least one memory element in said topology to have associated scan testing circuitry based on said data, a performance criterion of said integrated circuit, and performance characteristics of said memory elements such that associating said scan testing circuitry with said memory element negligibly impacts said performance criterion of said integrated circuit; and making a semiconductor mask with said mask maker based on said transmitted signals.

* * * * *